(12) United States Patent
Park et al.

(10) Patent No.: US 7,141,464 B2
(45) Date of Patent: Nov. 28, 2006

(54) METHOD OF FABRICATING T-TYPE GATE

(75) Inventors: Jong Moon Park, Daejeon (KR); Kun Sik Park, Daejeon (KR); Seong Wook Yoo, Daegu (KR); Yong Sun Yoon, Daejeon (KR); Sang Gi Kim, Daejeon (KR); Yoon Kyu Bae, Daejeon (KR); Byung Won Lim, Daejeon (KR); Jin Gun Koo, Daejeon (KR); Bo Woo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/179,983

(22) Filed: Jul. 12, 2005

(65) Prior Publication Data
US 2006/0079030 A1    Apr. 13, 2006

(30) Foreign Application Priority Data
Oct. 12, 2004    (KR) ...................... 10-2004-0081397

(51) Int. Cl.
*H01L 21/338*    (2006.01)
(52) U.S. Cl. .................. 438/182; 438/180; 438/579; 257/284; 257/280; 257/472; 257/E33.051; 257/E31.074
(58) Field of Classification Search ................ 438/182, 438/180, 579; 257/284, 280, E33.051, E31.074
See application file for complete search history.

(56) References Cited

U.S. PATENT DOCUMENTS

| 5,776,805 | A | * | 7/1998 | Kim | ........................... 438/182 |
| 5,930,610 | A | * | 7/1999 | Lee | ........................... 438/182 |
| 6,524,937 | B1 | | 2/2003 | Cheng et al. | |

FOREIGN PATENT DOCUMENTS

KR    10 0261268    4/2000

(Continued)

OTHER PUBLICATIONS

"T-Shape Gate Process & Its Application In HFET Fabrication" Zheng et al., Microelectronic R&D Center of Chinese Academy of Sciences, 2001 IEEE pp. 1334-1336.

(Continued)

*Primary Examiner*—Michelle Estrada
*Assistant Examiner*—Nicholas J. Tobergte
(74) *Attorney, Agent, or Firm*—Ladas & Parry LLP

(57) ABSTRACT

Provided is a method of fabricating a T-type gate including the steps of: forming a first photoresist layer, a blocking layer and a second photoresist layer to a predetermined thickness on a substrate, respectively; forming a body pattern of a T-type gate on the second photoresist layer and the blocking layer; exposing a predetermined portion of the second photoresist layer to form a head pattern of the T-type gate, and performing a heat treatment process to generate cross linking at a predetermined region of the second photoresist layer except for the head pattern of the T-type gate; performing an exposure process on an entire surface of the resultant structure, and then removing the exposed portion; and forming a metal layer of a predetermined thickness on an entire surface of the resultant structure, and then removing the first photoresist layer, the blocking layer, the predetermined region of the second photoresist layer in which the cross linking are generated, and the metal layer, whereby it is possible to readily perform a compound semiconductor device manufacturing process, and to reduce manufacturing cost by means of the increase of manufacturing yield and the simplification of manufacturing processes.

9 Claims, 3 Drawing Sheets

FOREIGN PATENT DOCUMENTS

KR        10 0274153        9/2000

OTHER PUBLICATIONS

"First demonstration of InAlAs/InGaAs HEMTs using T-gates fabricated by a bilayer of UVIII and PMMA resists" Chen et al., Nanoelectronics Research Centre, Department of Electronics and Electrical Engineering, 2000 IEEE pp. 202-205.

"Single step lithography for double-recessed gate pseudomorphic high electron mobility transistors" Grundbacher et al., J. Vac. Sci. Technol. B 15(1), Jan./Feb. 1997 pp. 49-52.

* cited by examiner

METHOD OF FABRICATING T-TYPE GATE

CROSS-REFERENCE TO RELATED APPLICATION

This application claims priority to and the benefit of Korean Patent Application No. 2004-81397, filed Oct. 12, 2004, the disclosure of which is incorporated herein by reference in its entirety.

BACKGROUND

1. Field of the Invention

The present invention relates to a method of fabricating a T-type gate and, more particularly, to a method of fabricating a T-type gate capable of facilitating a compound semiconductor device manufacturing process, enhancing the yield, and reducing the manufacturing cost by forming two kinds of patterns from one kind of photoresist layer using electron beam and photolithography technologies and by interposing a blocking layer between upper and lower photoresist layers for reversing the patterns.

2. Discussion of Related Art

In general, in methods of fabricating a compound semiconductor device such as a metal semiconductor field effect transistor (MESFET), a high electron mobility transistor (HEMT), a heterojunction bipolar transistor (HBT) and so on, which have ultra-high frequency characteristics as a high performance transistor, small parasitic elements of a gate electrode, high reliability, and high operating speed, a process of fabricating a T-type gate, which is a core process, individually adapts photoresist layers depending on each pattern in order to form a body and a head of the T-type gate. The process has difficulties in implementing the devices since it is difficult to realize a fine pattern, the process becomes complicated, and the device cannot be easily manufactured.

In a conventional method of forming a T-type gate, a fine body pattern of the T-type gate is formed by exposing and developing a first photoresist using electron beams. However, in forming the fine pattern using the electron beams, it is more difficult to adapt the photoresist layer on an insulating layers rather than a metal layer due to an electron charging effect.

In addition, in a process of transferring the fine pattern to a lower insulating layer using a predetermined photoresist layer as a mask, a two-step etching process including a dry etching process for allowing a portion of the insulating layer to remain in order to prevent the substrate from being damaged and a wet etching process for removing the remaining layer without damaging the substrate is required, thereby lengthening the process.

As described above, according to the conventional method, many steps are required and it is difficult to form the fine pattern. Also, a metal lift-off process cannot be smoothly performed since the metal is not deposited with a low step coverage required.

SUMMARY OF THE INVENTION

The present invention is directed to a method of fabricating a T-type gate capable of facilitating a compound semiconductor device manufacturing process, enhancing the yield, and reducing the manufacturing cost by forming two kinds of patterns from one kind of photoresist layer using electron beam and photolithography technologies and by interposing a blocking layer between upper and lower photoresist layers for reversing the patterns.

One aspect of the present invention is to provide a method of fabricating a T-type gate including steps of: (a) forming a first photoresist layer, a blocking layer and a second photoresist layer to a predetermined thickness on a substrate, respectively; (b) forming a body pattern of a T-type gate on the second photoresist layer and the blocking layer; (c) exposing a predetermined portion of the second photoresist layer to form a head pattern of the T-type gate, and performing a heat treatment process to generate cross linking at a predetermined region of the second photoresist layer except for the head pattern of the T-type gate; (d) performing an exposure process on an entire surface of the resultant structure, and then removing the exposed portion; and (e) forming a metal layer of a predetermined thickness on an entire surface of the resultant structure, and then removing the first photoresist layer, the blocking layer, the predetermined region of the second photoresist layer in which the cross linking are generated, and the metal layer.

In step (a), preferably, the blocking layer has a thickness of 10~30 nm.

Preferably, in step (b), the body pattern of the T-type gate is formed by exposing and developing a portion of the second photoresist layer through a direct lithography method using a predetermined electron beam, and transferring the exposed portion of the second photoresist layer to the blocking layer using a dry etching process.

Preferably, in step (c), when the second photoresist layer is exposed, a predetermined UV light is irradiated to a mask having the head pattern of the T-type gate.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

FIGS. 1A to 1H are cross-sectional views illustrating a method of fabricating a T-type gate in accordance with an embodiment of the present invention.

Figure 1A:
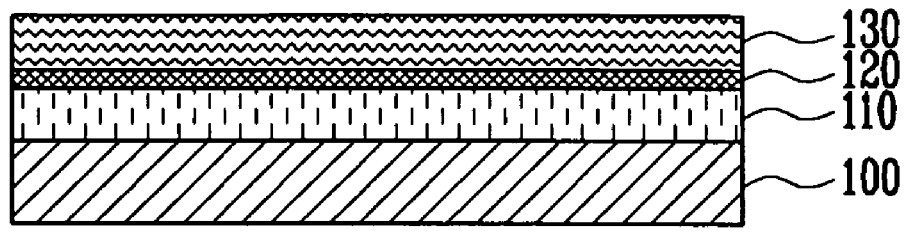
FIGS. 1A to 1H are cross-sectional views illustrating a method of fabricating a T-type gate in accordance with an embodiment of the present invention.

Referring to FIG. 1A, a lower photoresist layer 110 (for example, PFi-38A), which is sensitive to UV light, is formed to a predetermined thickness (for example, about 400 nm) on a compound wafer substrate 100, a blocking layer 120 (for example, made of Al or Ti) having a predetermined thickness (for example, about 20 nm) is deposited on the lower photoresist layer 110, and an upper photoresist layer 130 (for example, AZ5205) having a predetermined thickness (for example, about 600 nm) for reversing a pattern is formed on the blocking layer 120.

Figure 1B:
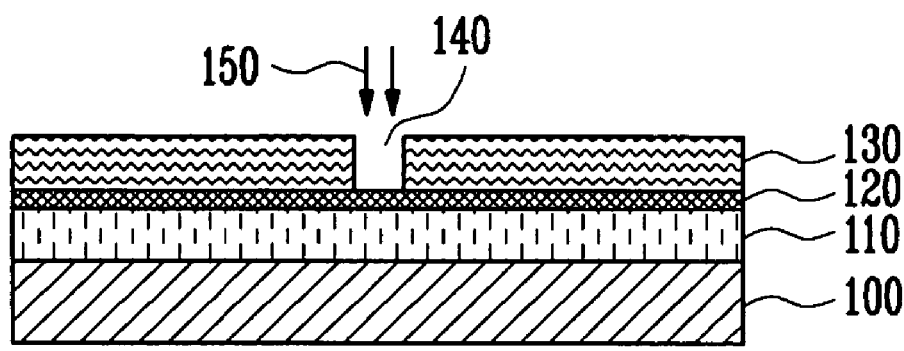

Referring to FIG. 1B, a predetermined electron beam 150 is irradiated on the upper photoresist layer 130 using a direct lithography method, and then the upper photoresist layer 130 is developed through a conventional development process, thereby forming a body pattern 140 of the T-type gate.

Figure 1C:
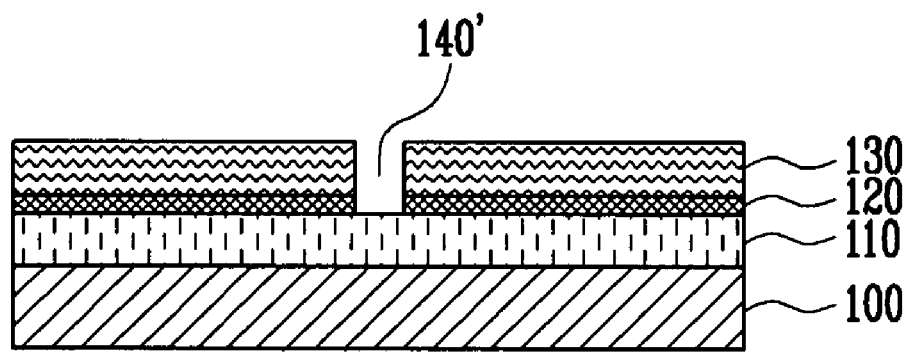

Referring to FIG. 1C, the body pattern 140 of the T-type gate formed through the upper photoresist layer 130 is transferred to the blocking layer 120 to form a body pattern 140' of the T-type gate using a conventional dry etching process.

Figure 1D:
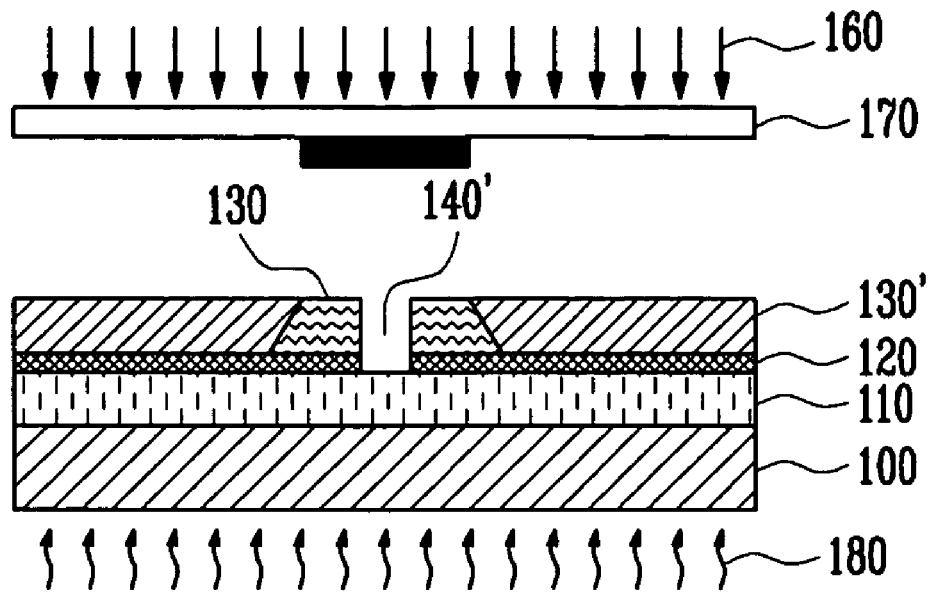

Referring to FIG. 1D, a predetermined UV light 160 is irradiated on a mask 170 having a head pattern of the T-type gate to expose a certain portion of the upper photoresist layer 130, and then a heat treatment process 180 is performed at a temperature of about 120° C. for 1 minute using a predetermined heat plate (not shown), thereby generating cross linking at a region 130' of the upper photoresist layer 130 except for the head pattern of the T-type gate.

Figure 1E:
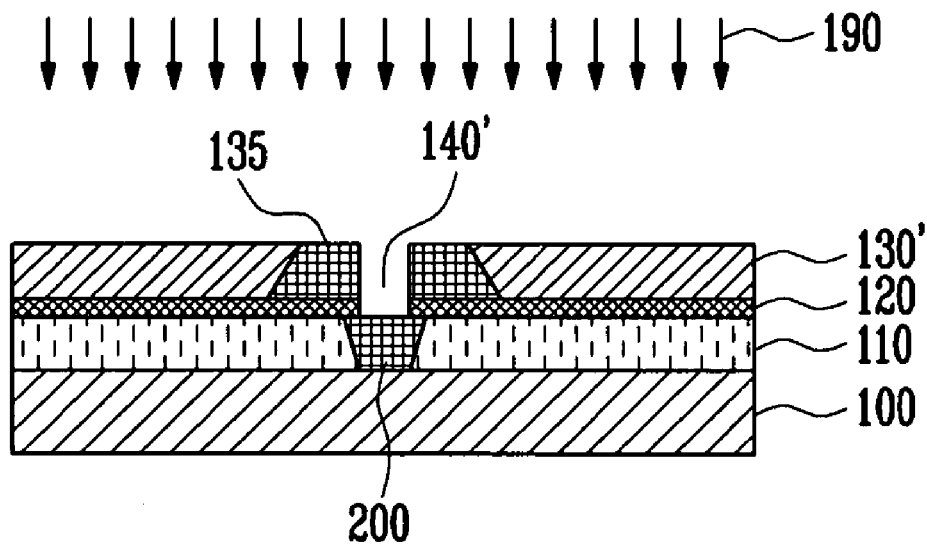

Referring to FIG. 1E, when a flood exposure process is performed using a predetermined UV light 190, while the region 130' of the upper photoresist layer that the cross linking was generated has a low solubility with regard to a developer because a photo chemical reaction is not raised in a photo reaction material, the certain portion of the upper photoresist layer 130 (see FIG. 1D) in which the cross linking was not generated has a high solubility with regard to the developer because a photo chemical reaction is raised in a photo reaction material. Thereby, a head pattern 135 of the T-type gate is formed.

In addition, the UV light 190 passed through the body pattern 140' of the T-type gate exposes the exposed region of the lower photoresist layer 110 to form a body pattern 200 of the T-type gate.

Figure 1F:
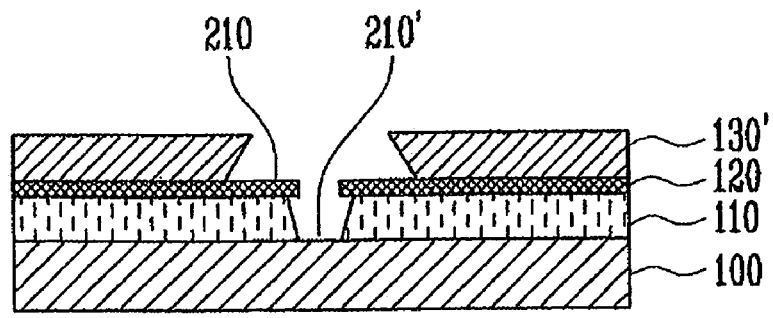

Referring to FIG. 1F, the exposed portions, i.e., the head pattern 135 and the body pattern 200 of the T-type gate are developed using a predetermined developer to form simultaneously a head pattern 210 of the T-type gate having a negative profile at the region 130' of the upper photoresist layer 130 in which the cross linking was generated and a body pattern 210' of the T-type gate having an undercut profile at the lower photoresist layer 110 under the blocking layer 120.

At this time, the negative profiled head pattern 210 and the undercut body pattern 210' of the T-type gate result in low metal step coverage on deposition of a metal layer, which is to be described later, thereby allowing a lift-off process to be easily performed. The length of the body pattern 210' is, for example, about 200 nm.

Figure 1G:
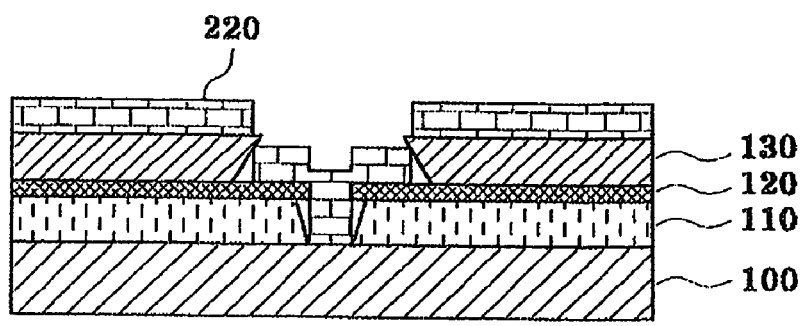

Referring to FIG. 1G, a metal layer (Ti/Pt/Au) 220 of a predetermined total thickness (for example, about 400 nm) is deposited on the entire surface of the resultant structure using a conventional electron-beam evaporator (not shown). The metal layer (Ti/Pt/Au) 220 is a three layer structure of Ti, Pt, Au, where for example the thickness of Ti layer is about 50 nm, the thickness of Pt layer is about 200 nm, and the thickness of Au layer is 250 nm. The thicknesses of these three layers could add up to about 400 nm according to an embodiment of the present invention.

Figure 1H:
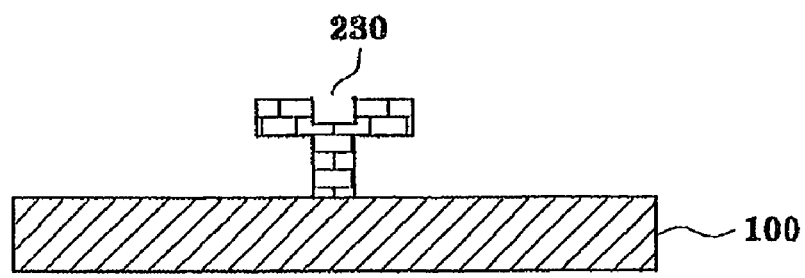

Referring to FIG. 1H, the lower photoresist layer 110, the blocking layer 120, the region 130' of the upper photoresist layer in which the cross linking was generated, and the metal layer 220 are simultaneously lifted-off to be removed using a photoresist removing solution such as acetone, thereby completing the manufacture of a predetermined T-type gate metal pattern 230.

According to the method of fabricating a T-type gate of the present invention, it is possible to readily fabricate a device, to reduce the number of manufacturing processes, to enhance the yield, and therefore, to reduce the manufacturing cost of the compound semiconductor device in comparison with a conventional method of using electron beam and light in a mixed manner.

That is, two kinds of patterns (the head and the body) required to define the fine T-pattern are formed using the upper photoresist layer 130 for reversing a pattern, thereby reducing the manufacturing processes.

In addition, the metallic blocking layer 120 is interposed between the upper and lower photoresist layers 10 and 130 to allow the fine pattern to be easily formed using electron beams and to prevent the fine body pattern of the T-type gate from being damaged during the following process. Especially, while it is difficult to form the fine pattern using the electron beam direct lithography method due to an electron charging effect on defining the fine pattern, the difficulty can be effectively improved by inserting the metallic blocking layer 120.

This is because the fine pattern is transferred to the blocking layer through the etching process to prevent the body pattern of the T-type gate formed by the predetermined electron beam from being damaged.

As can be seen from the foregoing, in accordance with the method of fabricating a T-type gate of the present invention, the adoption of a series of complex lithography processes of forming two kinds of gate patterns on one kind of photoresist layer, i.e., defining the body pattern of the T-type gate using electron beams and defining the head pattern of the T-type gate using UV light on the same photoresist layer makes a conventional photoresist layer removal and additional photoresist application process unnecessary, thereby effectively reducing manufacturing processes of the T-type gate, reducing manufacturing cost, and increasing yield and productivity, and therefore, more increasing competitive power in manufacturing compound semiconductor devices.

In addition, in accordance with the present invention, it is possible to readily define the fine pattern using electron beams by interposing the metallic blocking layer having a low electron charging effect in comparison with a conventional insulating layer (an oxide layer or a nitride layer) between the upper and lower photoresist layers, to prevent the fine body pattern of the T-type gate formed by the electron beams from being damaged in the following process, and to readily define the fine pattern by minimizing the electron charging effect.

Further, in accordance with the present invention, it is possible to readily perform a metal lift-off process by forming a photoresist layer having the head pattern and the body pattern of the T-type gate having low metal step coverage.

Furthermore, in accordance with the present invention, in forming the head pattern and the body pattern of the T-type gate, it is possible to effectively maintain the fine body pattern of the T-type gate required due to the characteristics of the device structure by transferring the fine pattern to the blocking layer after defining the body pattern using an electron beam direct lithography method.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A method of fabricating a T-type gate comprising the steps of:
    (a) forming a first photoresist layer, a blocking layer and a second photoresist layer to a predetermined thickness on a substrate, respectively;
    (b) forming a body patern of a T-type gate on the second photoresist layer and the blocking layer;
    (c) exposing a predetermined portion of the second photoresist layer to form a head pattern of the T-type gate, and performing a heat treatment process to generate cross linking at a predetermined region of the second photoresist layer except for the head pattern of the T-type gate;
    (d) performing an exposure process on an entire surface of the structure formed as a result of performing the steps (a), (b), and (c), and then removing the exposed portion; and
    (e) forming a metal layer of a predetermined thickness on an entire surface of the resultant structure, and then removing the first photoresist layer, the blocking layer, the predetermined region of the second photoresist layer in which the cross linking are generated, and the metal layer.

2. The method according to claim 1, wherein, in step (a), the blocking layer has a thickness of 10~30 nm.

3. The method according to claim 1, wherein, in step (b), the body pattern of the T-type gate is formed by exposing and developing a portion of the second photoresist layer through a direct lithography method using a predetermined electron beam, and transferring the exposed portion of the second photoresist layer to the blocking layer using a dry etching process.

4. The method according to claim 1, wherein, in step (c), when the second photoresist layer is exposed, a predetermined UV light is irradiated to a mask having the head pattern of the T-type gate.

5. The method according to claim 1, wherein, in step (c), the heat treatment process is performed at a temperature of 100~130° C. for 30~120 seconds using a predetermined heat plate.

6. The method according to claim 1, wherein, in step (d), while performing the exposure process on the entire surface, a predetermined UV light is irradiated to form the head pattern and the body pattern of the T-type gate on a certain portion of the second photoresist layer and the first photoresist layer, respectively.

7. The method according to claim 1, wherein, in step (d), the head pattern of the T-type gate having a negative profile and the body pattern of the T-type gate having an undercut shape are simultaneously formed on a region of the second photoresist layer and the first photoresist layer using a predetermined developer.

8. The method according to claim 1, wherein, in step (e), the metal layer is deposited using a predetermined electron beam evaporator, and the first photoresist layer, the blocking layer, a region of the second photoresist layer in which the cross linking was generated, and the metal layer are removed by simultaneously lifting-off using a predetermined photoresist removing solution.

9. The method according to claim 1, wherein the blocking layer is made of a metal material.

* * * * *